United States Patent
Yon et al.

(10) Patent No.: US 7,995,416 B2
(45) Date of Patent: Aug. 9, 2011

(54) SEMICONDUCTOR MEMORY DEVICE AND OPERATION METHOD THEREOF

(75) Inventors: Sun-Hyuck Yon, Kyoungki-do (KR); Kee-Teok Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 420 days.

(21) Appl. No.: 12/165,065

(22) Filed: Jun. 30, 2008

(65) Prior Publication Data

US 2009/0168584 A1    Jul. 2, 2009

(30) Foreign Application Priority Data

Dec. 26, 2007    (KR) .................. 10-2007-0138018

(51) Int. Cl.
*G11C 5/14*    (2006.01)
(52) U.S. Cl. .............. 365/226; 365/233.1; 365/227; 365/194; 365/233.11; 365/233.13
(58) Field of Classification Search .............. 365/194, 365/226, 227, 233.1, 233.11, 233.13
See application file for complete search history.

(56) References Cited

U.S. PATENT DOCUMENTS

| | | | | |
|---|---|---|---|---|
| 7,761,757 B2* | 7/2010 | Yun et al. | | 714/724 |
| 7,821,308 B2* | 10/2010 | You | | 327/158 |
| 2003/0156462 A1* | 8/2003 | Lim et al. | | 365/189.05 |

FOREIGN PATENT DOCUMENTS

| | | |
|---|---|---|
| KR | 10-0206508 | 7/1999 |
| KR | 1020010006851 A | 1/2001 |
| KR | 1020030014790 A | 2/2003 |
| KR | 10-2006-0038603 A | 5/2006 |

OTHER PUBLICATIONS

Notice of Preliminary Rejection issued from Korean Intellectual Property Office on Apr. 28, 2009 with an English Translation.
Notice of Allowance issued from Korean Intellectual Property Office on Nov. 16, 2009.

* cited by examiner

*Primary Examiner* — Vu A Le
*Assistant Examiner* — Han Yang
(74) *Attorney, Agent, or Firm* — IP & T Group LLP

(57) ABSTRACT

A semiconductor memory device includes a clock synchronizing unit for receiving a first power voltage through a first power voltage terminal, and an additional power voltage providing unit for additionally providing a second power voltage to the first power voltage terminal for a predetermined period after leaving a power down mode.

22 Claims, 4 Drawing Sheets

ESCAPING POWER DOWN MODE

US 7,995,416 B2

SEMICONDUCTOR MEMORY DEVICE AND OPERATION METHOD THEREOF

CROSS-REFERENCE TO RELATED APPLICATIONS

The present invention claims priority of Korean patent application number 2007-0138018, filed on Dec. 26, 2007, which is incorporated by reference in its entirety.

BACKGROUND OF THE INVENTION

The present invention relates to a semiconductor memory device and to a method for driving the semiconductor memory device. More particularly, the invention relates to stably providing a clock at the memory device at a predetermined timing after a power down mode.

Generally, semiconductor memory devices such as a double data rate synchronous DRAM (DDR SDRAM) receive external clock signals to generate internal clock signals. A number of circuits in such semiconductor memory devices receive the internal clock signals for use as reference clocks of corresponding circuits. A clock skew may occur in a semiconductor memory device due to a delay generated by a transmission route for transmitting the internal clock in the semiconductor memory device. Thus, the semiconductor memory device includes a clock synchronization circuit to compensate the clock skew. A phase locked loop (PLL) and a delay locked loop (DLL) represent the clock synchronization circuit.

The semiconductor memory device receives an external power voltage to generate internal power voltages. The internal power voltages operate at various voltage levels. For example, the internal power voltages include a pumping power voltage that is supplied to word lines and higher than the external power voltage, a core power voltage supplied to a bit line sense amp amplifier, a peripheral circuit power voltage supplied to a peripheral circuit, and a DLL power voltage supplied to a DLL.

The semiconductor memory devices have been developed to meet requirements for very large scale integration, high-speed, and low power. Generally, a power down mode is used for low power consumption. The power down mode indicates an operation mode for minimizing current consumption in the semiconductor memory device. When the semiconductor memory device enters the power down mode, it consumes minimum current.

FIG. 1 is a block diagram of a typical DLL.

Referring to FIG. 1, the DLL includes a phase detecting unit 110, a control signal generating unit 130, a variable delaying unit 150, and a delay replicating unit 170.

The phase detecting unit 110 detects phases of an external clock signal CLK_EXT and a feedback clock signal CLK_FED to output a detect signal DET. The control signal generating unit 130 generates a corresponding delay control signal CNT_D in response to the detect signal DET. The variable delaying unit 150 delays the external clock signal CLK_EXT in response to the delay control signal CNT_D to generate a DLL clock signal CLK_DLL. The delay replicating unit 170 delays the DLL clock signal CLK_DLL for a time caused by a clock path through which the external clock signal CLK_EXT is transmitted to a data output circuit to generate a feedback clock signal CLK_FED.

The variable delaying unit 150 includes a plurality of unit delay cells (not shown). The variable delaying unit 150 receives an operation voltage from a DLL power voltage V_DLL.

FIG. 2 is a timing diagram showing a locking operation of the DLL in FIG. 1. For the convenience of explanation, it is assumed that the cycle of an external clock signal CLK_EXT is 10 ns and a phase difference between the locked DLL clock signal CLK_DLL and the external clock signal CLK_EXT is 2 n. It is assumed that each of the unit delaying cell delays an input signal for 70 ps and the variable delaying unit 150 is set to delay the external clock signal CLK_EXT for 1 ns at an initial operation time. An initial delay time of the external clock signal CLK_EXT is 1 ns.

Referring to FIGS. 1 and 2, the phase detecting unit 110 compares the external clock signal CLK_EXT with the feedback clock signal CLK_FED to output the detect signal DET. Then, the control signal generating unit 130 generates a delay control signal CNT_D according to the detect signal DET. The variable delaying unit 150 changes the number of activated unit delay cells in response to the delay control signal CNT_D.

When hundred unit delay cells in the variable delaying unit 150 are activated, the variable delaying unit 150 delays the external clock signal CLK_EXT for 8 ns.

When the variable delaying unit 150 delays 8 ns, a phase difference between the DLL clock signal CLK_DLL and the external cock signal CLK_EXT becomes 2 ns. In this case, the feedback clock signal CLK_FED from the delay replicating unit 170 is synchronized with the external clock signal CLK_EXT. This state is called that the DLL clock signal CLK_DLL is locked.

A normal mode is described, hereinbefore. The semiconductor memory device enters the power down mode after a normal mode.

Hereinafter, the power down mode is described in detail. When the semiconductor memory device enters the power down mode, the DLL stores locking information and stops the locking operation. When the semiconductor memory device leaves the power down mode, the variable delaying unit 150 starts to operate with the locking information stored before entering the power down mode. The DLL power voltage V_DLL supplied to the variable delaying unit 150 may drop due to an immediate circuit operation. Because the power voltage should be provided to all circuits in the memory device when the semiconductor memory device escapes the power down mode.

FIG. 3 is a timing diagram showing a problem occurring after leaving the power down mode.

Referring to FIGS. 1 to 3, the DLL clock signal CLK_DLL is locked totally to be delayed for 8 ns in the locking state. In detail, the DLL clock signal CLK_DLL is set to be initially delayed for 1 ns and then delayed for 7 ns by hundred unit delay cells of the variable delaying unit 150.

When the semiconductor memory device escapes the power down mode, since the power voltage is supplied to lots of circuit blocks in the memory device, the power voltage V_DLL temporally drops. Thus, delay time of the unit delay cells in the variable delaying unit 150 increases. That is, when the variable delaying unit 150 is locked for 8 ns by hundred unit delay cells before entering the power down mode, the delay time of the variable delaying unit 150 temporally increases when the semiconductor memory device escapes the power down mode. The delay time in hundred unit delay cells increases due to the voltage drop of the power voltage V_DLL. That means that the DLL clock signal CLK_DLL is delayed for delay time of 8 n+a.

Because of that, a DQS signal, i.e., a reference signal for outputting data, generated by the DLL clock signal CLK_DLL does not have a predetermined timing in comparison with the external clock signal CLK_EXT. A tDQSCK, i.e., a margin timing which is a specification between the external clock signal CLK_EXT and the DQS signal, is not satisfied. The more unit delay cells are used before entering the power down mode, the more difficult it becomes to be satisfied with the tDQSCK.

SUMMARY OF THE INVENTION

Embodiments of the present invention are directed to provide a semiconductor memory device and operation method thereof.

This invention provides a memory device for providing a stable power voltage in the power down mode, and a method for operating the same.

Furthermore, this invention also provides a memory device including a clock synchronization circuit for generating internal clocks having a predetermined timing when leaving the power down mode.

In accordance with a first aspect of the invention, there is provided a semiconductor memory device including a clock synchronizing unit for receiving a first power voltage through a first power voltage terminal, and an additional power voltage providing unit for additionally providing a second power voltage to the first power voltage terminal for a predetermined period after leaving a power down mode.

In accordance with a second aspect of the invention, there is provided a semiconductor memory device including a phase detecting unit for detecting phases of an external clock signal and a feedback clock signal to output a detect signal, a control signal generating unit for generating a delay control signal in response to the detect signal, a variable delaying unit for receiving the first power voltage as an operation voltage through the first power voltage terminal to delay an external clock signal in response to the delay control signal, a delay replicating unit for delaying an output clock of the variable delaying unit by a modeling delay value to output a feedback clock signal, and an additional power voltage providing unit for additionally providing a second power voltage to the first power voltage terminal for a predetermined period after leaving a power down mode.

In accordance with a third aspect of the invention, there is provided a semiconductor memory device including a phase detecting unit for detecting phases of an external clock signal and a feedback clock signal to output a detect signal, a control signal generating unit for generating a voltage control signal having a voltage level corresponding to the detect signal, a variable delaying unit for receiving the first power voltage through the first power voltage terminal to generate an oscillation signal having a frequency corresponding to the external clock signal in response to the delay control signal, and an additional power voltage providing unit for additionally providing a second power voltage to the first power voltage terminal for a predetermined period after leaving a power down mode.

In accordance with a fourth aspect of the invention, there is provided a method for driving a semiconductor memory device with a power down mode. The method includes receiving a first power voltage through a first power voltage terminal in a normal mode to drive a clock synchronization circuit, and additionally providing a second power voltage to the first power voltage terminal for a predetermined period after leaving the power down mode.

DESCRIPTION OF SPECIFIC EMBODIMENTS

Embodiments of the present invention relate to a semiconductor memory device and operation method thereof.

Figure 4:
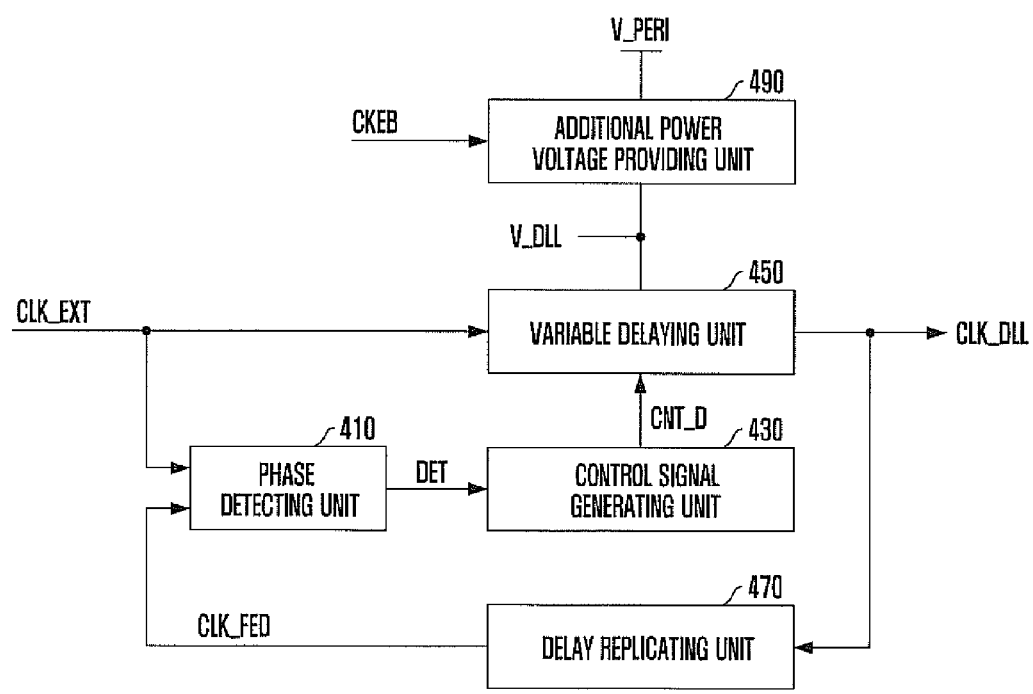
FIG. 4 is a block diagram of a DLL in accordance with an embodiment of the present invention.

FIG. 4 is a block diagram of a DLL in accordance with an embodiment of the invention.

Referring to FIG. 4, the DLL includes a phase detecting unit 410, a control signal generating unit 430, a variable delaying unit 450, a delay replicating unit 470, and an additional power voltage providing unit 490.

The phase detecting unit 410 detects phases of an external clock signal CLK_EXT and a feedback clock signal CLK_FED to generate a detect signal DET. The control signal generating unit 430 generates a delay control signal CNT_D according to the detect signal DET.

Then, the variable delaying unit 450 delays the external clock signal CLK_EXT in response to the delay control signal CNT_D to outputs the DLL clock signal CLK_DLL. The variable delaying unit 450 includes a plurality of unit delay cells, which operate with the DLL power voltage V_DLL provided by a DLL power voltage terminal.

The delay replicating unit 470 delays the DLL clock signal CLK_DLL for a time caused by a clock path through which the external clock signal CLK_EXT is transmitted to a data output circuit to generate a feedback clock signal CLK_FED.

The additional power voltage providing unit 490 additively provides a peripheral circuit power voltage V_PERI to the DLL power voltage terminal for a predetermined period in response to a power down mode signal CKEB, after the semiconductor memory device leaves the power down mode.

The power down mode signal CKEB is a control signal indicating whether the device is in the power mode or not. For instance, when the semiconductor memory device enters the power down mode, the power down mode signal CKEB becomes logic 'high', and when leaving the power down mode, the power down mode signal CKEB becomes logic 'low'.

Figure 1:
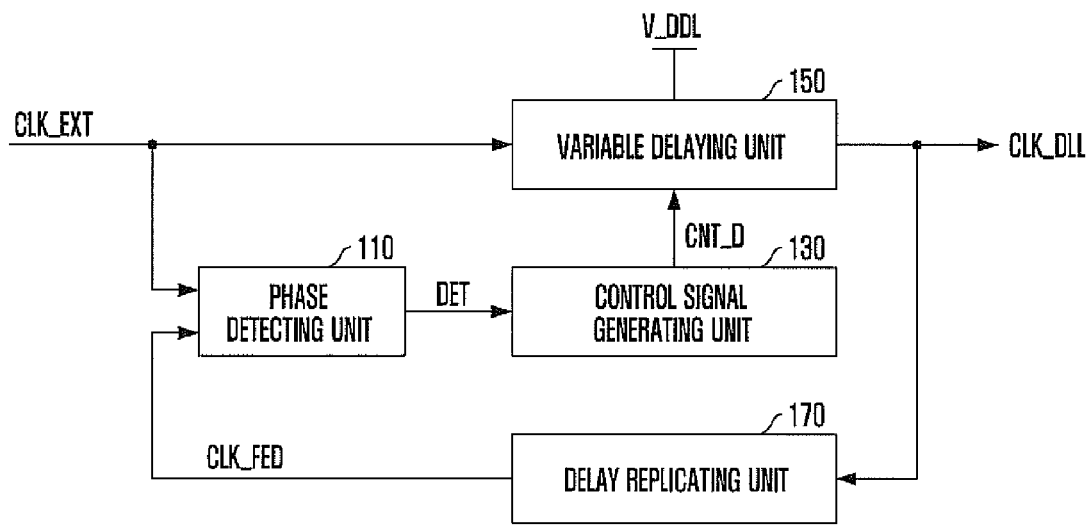
FIG. 1 is a block diagram of a typical DDL.
Figure 2:
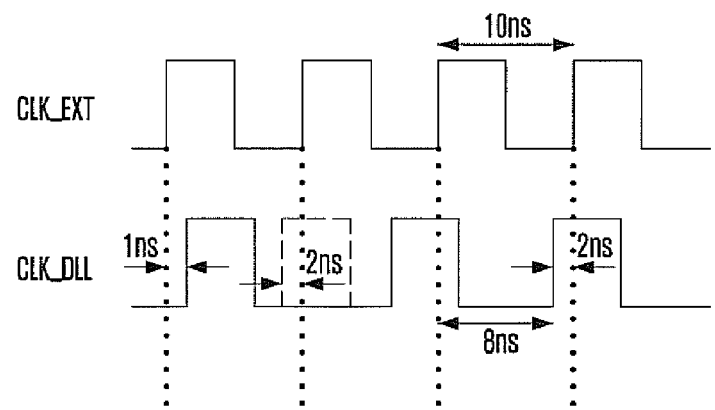
FIG. 2 is a timing diagram showing a locking operation of the DLL in FIG. 1.
Figure 3:
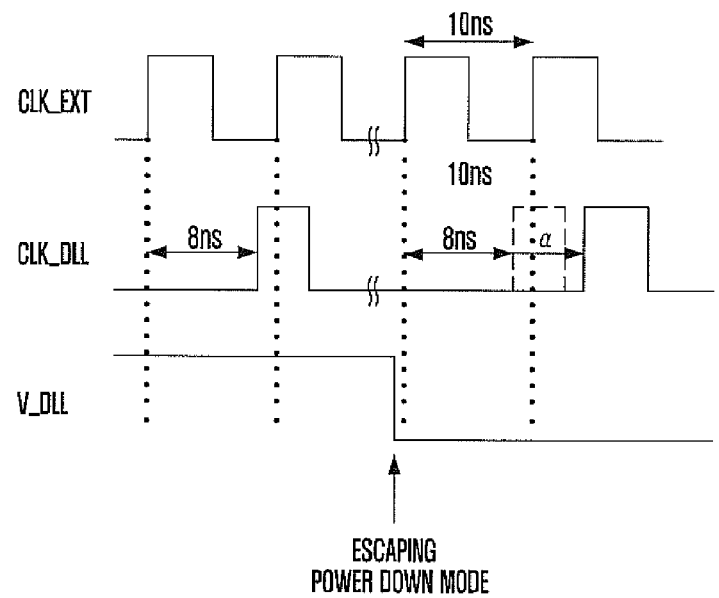
FIG. 3 is a timing diagram showing a problem occurring after leaving the power down mode.

The semiconductor memory device further includes an additional power voltage providing unit 490 to prevent the voltage drop from occurring when leaving the power down mode in comparison with the prior art in FIG. 1. Hereinafter, the additional power voltage providing unit 490 is described in detail referring to FIG. 5.

Figure 5:
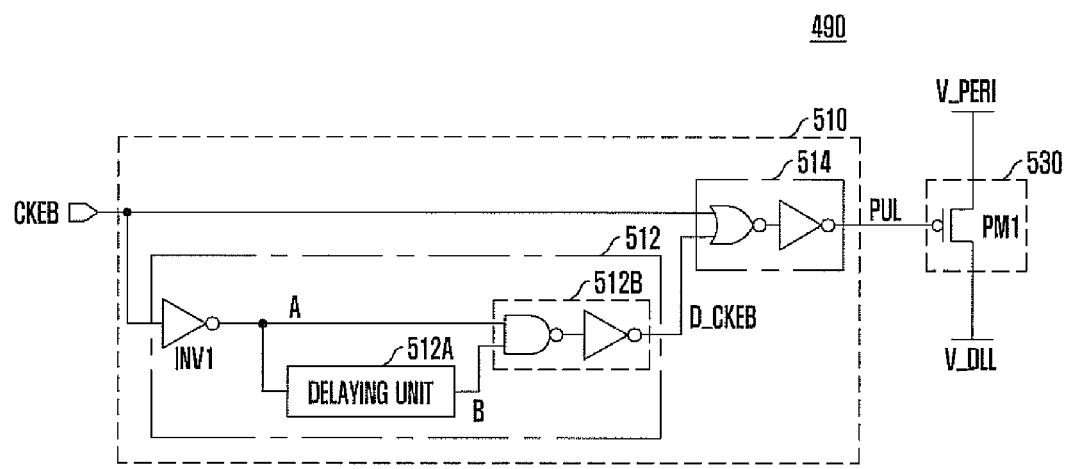
FIG. 5 is a circuit diagram of the additional power voltage providing unit in FIG. 4.

FIG. 5 is a circuit diagram of the additional power voltage providing unit in FIG. 4.

Referring to FIG. 5, the additional power voltage providing unit 490 includes a pulse signal generating unit 510 and a power voltage connecting unit 530. The pulse signal generating unit 510 generates a pulse signal PUL enabled from a disable time of the power down mode signal CKEB. The power voltage connecting unit 350 connects the DLL power voltage terminal to the peripheral circuit power voltage terminal in response to the pulse signal PUL.

The pulse signal generating unit 510 generates the control signal, i.e., the pulse signal PUL, which is activated for a predetermined period from a disable timing of the power down mode signal CKEB. The pulse signal generating unit 510 includes a delay circuit 512 and a pulse signal outputting unit 514. The delay circuit 512 generates a delay signal D_CKEB for shifting a disable transition timing of the power down mode CKEB for a predetermined period. The pulse signal outputting unit 514 outputs the pulse signal PUL in response to the power down mode signal CKEB and the delay signal D_CKEB.

The delay circuit 512 includes an inverter INV1, a delaying unit 512A, and an outputting unit 512B. The inverter INV1 inverts a logic level of the power down mode signal CKEB. The delaying unit 512A delays a first output signal A of the inverter INV1 for a predetermined period. The outputting unit 512B outputs a delay signal D_KEB in response to the first signal A of the inverter INV1 and a second signal B of the delaying unit 512A.

The power voltage connecting unit 530 includes a PMOS transistor PM1 having a source/drain path between the DLL power voltage V_DLL and the peripheral power voltage V_PERI, and receives the pulse signal PUL.

The peripheral circuit power voltage V_PERI has a voltage level substantially the same as that of the DLL power voltage V_DLL in this embodiment. The peripheral circuit power voltage V_PERI also can be higher than a predetermined voltage level of DLL power voltage V_DLL.

An active period of the pulse signal PUL is determined as a voltage level of the peripheral circuit power voltage V_PERI. That is, the active period of the pulse signal PUL can be shortened if the peripheral circuit power voltage V_PERI has relatively a high voltage level. When the peripheral circuit power voltage V_PERI has a low voltage level, the active period of the pulse signal PUL should be extended.

Figure 6:
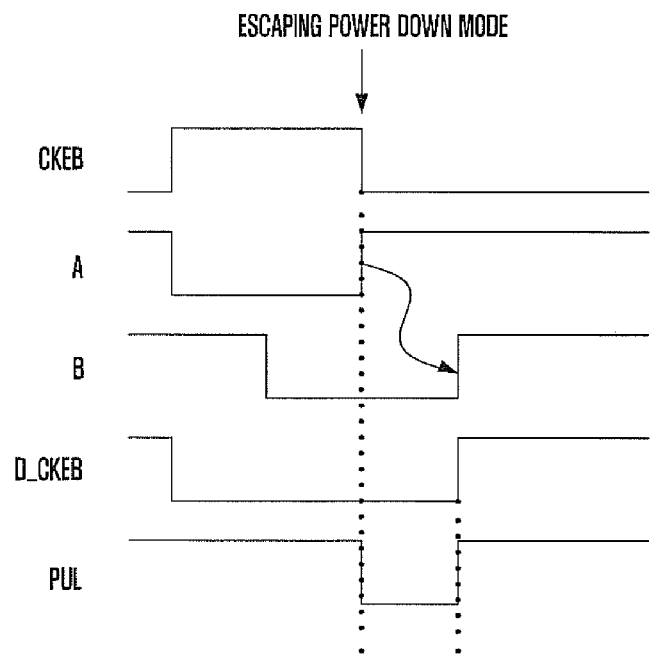
FIG. 6 is a timing diagram showing signals inputted to/outputted from the additional power voltage providing unit 490 in FIG. 5.

FIG. 6 is a timing diagram showing signals inputted to/outputted from the additional power voltage providing unit 490 in FIG. 5. The power down mode CKEB, the first signal A of the inverter IVN1, the second signal B of the delaying unit 512B, and the pulse signal PUL are illustrated in FIG. 6.

Referring to FIG. 6, the pulse signal PUL is activated as a logic 'low' for a predetermined time after leaving the power down mode, i.e., after the power down mode signal CKEB becomes logic 'low'.

The PMOS transistor PM1 in the power voltage connecting unit 530 is turned on for the predetermined time in response to the pulse signal PUL. The peripheral circuit power voltage V_PERI is supplied to the DLL power voltage terminal during the predetermined time.

According to the conventional method, the DLL power voltage V_DLL drops when leaving the power down mode. However, according to the invention, the additional power voltage, i.e., the peripheral circuit power voltage V_PERI is supplied to the DLL power voltage terminal for the predetermined period after leaving the power down mode, thereby preventing a voltage drop of the DLL power voltage V_DLL.

Thus, the variable delaying unit 450 reliably maintains a delay value fixed before entering the power down mode, even after leaving the power down mode. It is possible to reliably output the DLL clock signal CLK_DLL. That means that a DQS signal using the DLL signal CLK_DLL is reliably generated within the margin timing tDQSCK.

Figure 7:
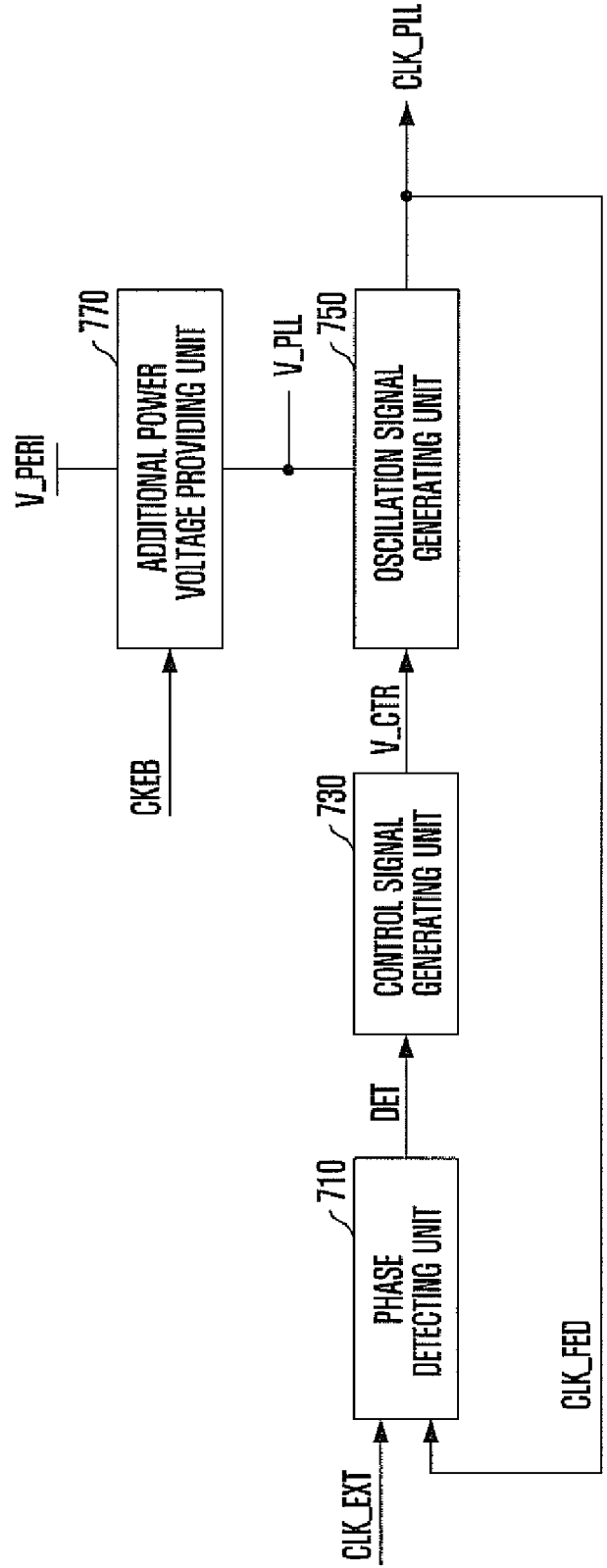
FIG. 7 is a block diagram of a PLL in accordance with an embodiment of the invention.

FIG. 7 is a block diagram of a PLL circuit in accordance with an embodiment of the invention.

Referring to FIG. 7, the PLL circuit includes a phase detecting unit 710, a control signal generating unit 730, an oscillation signal generating unit 750, and an additional power voltage providing unit 770. The phase detecting unit 710 detects phases of an external clock signal CLK_EXT and a feedback clock signal CLK_FED. The control signal generating unit 730 generates a voltage control signal V_CTR with a voltage level in response to the detect signal DET. The oscillation signal generating unit 750 generates a PLL clock signal CLK_PLL for receiving the PLL power voltage V_PLL through the PLL power voltage terminal wherein the PLL clock signal CLK_PLL has a frequency corresponding to the voltage control signal V_CTR. The additional power voltage providing unit 770 provides the peripheral power voltage V_PERI to the PLL power voltage terminal for the predetermined period after leaving the power down mode. The additional power voltage providing unit 770 has substantially the same function as the additional power voltage providing unit 490 in FIG. 4.

The oscillation signal generating unit 750 can be embodied in various types. For instance, the oscillation signal generating unit 750 may be embodied as a ring oscillator. The ring oscillator has a plurality of inverting delay devices connected to each other. The ring oscillator is well known to those skilled in the art and detailed description is omitted here.

The PLL power voltage V_PLL is applied to the PLL circuit and functions like the DLL power voltage V_DLL in FIG. 4. The PLL by this embodiment reliably generates stable the PLL clock signal CLK_PLL after leaving the power down mode, like the DLL in FIG. 4.

Operation method and the circuit composition of the PLL are well known to ordinary person in the skilled art.

As described, a semiconductor memory device by the invention provides the additional power voltage to a clock synchronization circuit such as a DLL or a PLL for predetermined time after leaving the power down mode. Thus, it is possible to reliably generate an internal clock signal even after leaving the power down mode.

While the invention has been described with respect to the specific embodiments, the above embodiments of the invention are illustrative and not limitative. It will be apparent to those skilled in the art that various changes and modifications may be made without departing from the spirit and scope of the invention as defined in the following claims.

For instance, referring back to FIG. 5, the power voltage connecting unit 530 includes the PMOS transistor PM1. However, the power voltage connecting unit 530 can include a NMOS transistor instead of the PMOS transistor PM1. Furthermore, formation position and the kind of above-described logic gate and transistor can be changed according to polarity of the inputted signal.

The embodiment of the invention is described using the DLL and the PLL as an example. However, this invention can be applied to any other circuits where the voltage drop occurs when leaving the power down mode.

In this invention, an additional power is provided to a power voltage terminal for a predetermined period after leaving a power down mode. Thus, a power voltage can be reliably provided to a clock synchronization circuit not to occur a voltage drop when leaving the power down mode.

What is claimed is:

1. A semiconductor memory device, comprising:
   a clock synchronizing unit for receiving a first power voltage through a first power voltage terminal; and
   an additional power voltage providing unit for additionally providing a second power voltage to the first power voltage terminal for a predetermined period after leaving a power down mode,
   wherein the additional power voltage providing unit is configured to, in additionally providing the second power voltage to the first power voltage terminal for the predetermined period after leaving the power down mode, additionally provide the second power voltage to the first power voltage terminal at the same time that the first power voltage is being provided to the first power voltage terminal.

2. The device of claim 1, wherein the second power voltage has a voltage level higher than the first power voltage.

3. The device of claim 1, wherein the predetermined period has a duration that depends on a voltage level of the second power voltage.

4. The device of claim 1, wherein the clock synchronizing unit comprises a delay locked loop (DLL) or a phase locked loop (PLL).

5. A semiconductor memory device, comprising:
   a phase detecting unit configured to compare the phase of an external clock signal and the phase of a feedback clock signal to output a detect signal;
   a control signal generating unit for generating a delay control signal in response to the detect signal;
   a variable delaying unit configured to receive a first power voltage as an operation voltage through a first power voltage terminal to delay an external clock signal in response to the delay control signal;
   a delay replicating unit configured to delay an output clock of the variable delaying unit by a modeling delay value to output a feedback clock signal; and
   an additional power voltage providing unit configured to additionally provide a second power voltage to the first power voltage terminal for a predetermined period after leaving a power down mode,
   wherein the additional power voltage providing unit is configured to, in additionally providing the second power voltage to the first power voltage terminal for the predetermined period after leaving the power down mode, additionally provide the second power voltage to the first power voltage terminal at the same time that the first power voltage is being provided to the first power voltage terminal.

6. The device of claim 5, wherein the additional power voltage providing unit comprises:
   a pulse signal generating unit configured to generate a pulse signal activated for the predetermined period in response to a power down mode signal indicating whether the device is in the power down mode or not; and
   a power voltage connecting unit configured to connect the first power voltage terminal to a second power voltage terminal in response to the pulse signal.

7. The device of claim 6, wherein the pulse signal generating unit comprises:
   a delay circuit configured to delay a disable transition timing of the power down mode to generate a delay signal; and
   a pulse signal outputting unit configured to generate the pulse signal in response to the power down mode signal and the delay signal.

8. The device of claim 7, wherein the delay circuit comprises:
   an inverting unit configured to invert the power down mode signal;
   a delaying unit configured to delay a first output signal of the inverting unit; and
   an outputting unit configured to output the delay signal in response to the first output signal of the inverting unit and a second output signal of the delaying unit.

9. The device of claim 6, wherein the power voltage connecting unit comprises:
   a metal oxide semiconductor (MOS) transistor having a source/drain path between the first power voltage terminal and the second power voltage terminal and receiving the pulse signal at a gate.

10. The device of claim 5, wherein the variable delaying unit comprises a plurality of unit delay cells.

11. The device of claim 10, wherein each of the plurality of unit delay cells receives the first power voltage and at least one of the plurality of unit delay cells is provided with the second power voltage for the predetermined period after leaving the power down mode.

12. The device of claim 5, wherein the second power voltage has a voltage level higher than the first power voltage.

13. The device of claim 5, wherein the predetermined period has a duration that depends on a voltage level of the second power voltage.

14. A semiconductor memory device, comprising:
   a phase detecting unit configured to compare phases of an external clock signal and a feedback clock signal to output a detect signal;
   a control signal generating unit configured to generate a voltage control signal having a voltage level corresponding to the detect signal;
   an oscillation signal generating unit configured to receive a first power voltage through a first power voltage terminal to generate an oscillation signal having a frequency corresponding to the external clock signal in response to the voltage control signal; and
   an additional power voltage providing unit configured to additionally provide a second power voltage to the first power voltage terminal for a predetermined period after leaving a power down mode,
   wherein the additional power voltage providing unit is configured to, in additionally providing the second power voltage to the first power voltage terminal for the predetermined period after leaving the power down mode, additionally provide the second power voltage to the first power voltage terminal at the same time that the first power voltage is being provided to the first power voltage terminal.

15. The device of claim 14, wherein the additional power voltage providing unit comprises:
   a pulse signal generating unit configured to generate a pulse signal activated for the predetermined period in response to a power down mode signal indicating whether the device is in the power down mode or not; and
   a power voltage connecting unit configured to connect the first power voltage terminal to a second power voltage terminal in response to the pulse signal.

16. The device of claim 15, wherein the pulse signal generating unit comprises:
   a delay circuit configured to delay a disable transition timing of the power down mode to generate a delay signal; and a pulse signal outputting unit configured to generate the pulse signal in response to the power down mode signal and the delay signal.

17. The device of claim 16, wherein the delay circuit comprises:
- an inverting unit configured to invert the power down mode signal;
- a delaying unit configured to delay an output signal of the inverting unit; and
- a delay signal outputting unit configured to output the delay signal in response to a first output signal of the inverting unit and a second output signal of the delaying unit.

18. The device of claim 15, wherein the power voltage connecting unit comprises:
- a MOS transistor having a source/drain path between the first power voltage terminal and the second power voltage terminal and receiving the pulse signal at a gate.

19. The device of claim 14, wherein the oscillation signal generating unit comprises a plurality of unit delay cells.

20. The device of claim 19, wherein each of the plurality of unit delay cells receives the first power voltage and at least one of the plurality of unit delay cells receives with the second power voltage for the predetermined period after leaving the power down mode.

21. The device of claim 14, wherein the second power voltage has a voltage level higher than the first power voltage.

22. The device of claim 14, wherein the predetermined period corresponds to the second power voltage.

* * * * *